US012444567B2

(12) United States Patent
Mizumura et al.

(10) Patent No.: US 12,444,567 B2
(45) Date of Patent: Oct. 14, 2025

(54) FOCUSED CHARGED PARTICLE BEAM APPARATUS

(71) Applicant: V TECHNOLOGY CO., LTD., Yokohama (JP)

(72) Inventors: Michinobu Mizumura, Yokohama (JP); Toshinari Arai, Yokohama (JP); Takanori Matsumoto, Yokohama (JP); Takuro Takeshita, Yokohama (JP)

(73) Assignee: V TECHNOLOGY CO., LTD., Kanagawa (JP)

( * ) Notice: Subject to any disclaimer, the term of this patent is extended or adjusted under 35 U.S.C. 154(b) by 341 days.

(21) Appl. No.: 18/025,809

(22) PCT Filed: Jul. 27, 2021

(86) PCT No.: PCT/JP2021/027703
§ 371 (c)(1),
(2) Date: Mar. 10, 2023

(87) PCT Pub. No.: WO2022/054431
PCT Pub. Date: Mar. 17, 2022

(65) Prior Publication Data
US 2023/0335369 A1    Oct. 19, 2023

(30) Foreign Application Priority Data
Sep. 14, 2020 (JP) .................. 2020-154036

(51) Int. Cl.
*H01J 37/18* (2006.01)
*H01J 37/32* (2006.01)
*H01J 37/317* (2006.01)

(52) U.S. Cl.
CPC ........ *H01J 37/18* (2013.01); *H01J 37/32449* (2013.01); *H01J 37/3174* (2013.01)

(58) Field of Classification Search
CPC ... H01J 37/20; H01J 37/32449; H01J 37/3174
See application file for complete search history.

(56) References Cited

U.S. PATENT DOCUMENTS

| | | | |
|---|---|---|---|
| 4,524,261 A | 6/1985 | Petric et al. | |
| 4,837,443 A | 6/1989 | Young et al. | |

(Continued)

FOREIGN PATENT DOCUMENTS

| | | |
|---|---|---|
| CN | 1551279 A | 12/2004 |
| JP | S6071038 A | 4/1985 |

(Continued)

OTHER PUBLICATIONS

International Search Report (PCT/ISA/210) mailed Oct. 26, 2021, by the Japanese Patent Office as the International Searching Authority for International Application No. PCT/JP2021/027703. (5 pages).

(Continued)

*Primary Examiner* — Wyatt A Stoffa
(74) *Attorney, Agent, or Firm* — LUCAS & MERCANTI, LLP

(57) ABSTRACT

A focused charged particle beam apparatus which includes a support which supports a substrate to be processed and a focused charged particle beam column equipped with a differential pumping device movable to a location facing a given area of a process target surface of the substrate. The support bears only a periphery of the substrate while keeping the substrate horizontal. A positive pressure chamber is disposed below the substrate borne by the support and works to exert a positive pressure on the whole of the process target area of the substrate to cancel deflection of the substrate arising from its own weight. A local depressurizing mechanism is arranged in the positive pressure chamber and placed out of contact with the substrate. The local depressurizing mechanism works to exert a negative pressure on a lower surface of the substrate to cancel a suction force created by (Continued)

the differential pumping device. The local depressurizing mechanism is movable relative to the substrate following movement of the differential pumping device while facing the differential pumping device through the substrate.

7 Claims, 9 Drawing Sheets

(56) References Cited

U.S. PATENT DOCUMENTS

| | | | | |
|---|---|---|---|---|
| 6,515,288 | B1* | 2/2003 | Ryding | F16C 32/0603 |
| | | | | 250/462.1 |
| 6,903,805 | B2* | 6/2005 | Schneider | G03F 7/70766 |
| | | | | 355/72 |
| 2002/0000029 | A1* | 1/2002 | Emoto | F16L 9/19 |
| | | | | 700/121 |
| 2005/0132962 | A1* | 6/2005 | Emoto | G03F 7/70716 |
| | | | | 700/121 |
| 2009/0101816 | A1 | 4/2009 | Noji et al. | |
| 2012/0064460 | A1* | 3/2012 | Aoki | G03F 7/70716 |
| | | | | 355/53 |
| 2015/0325455 | A1* | 11/2015 | Kitagawa | H01J 37/32403 |
| | | | | 438/798 |
| 2020/0126771 | A1 | 4/2020 | Roh et al. | |
| 2023/0163018 | A1* | 5/2023 | Satou | H01L 21/683 |
| | | | | 269/20 |

FOREIGN PATENT DOCUMENTS

| | | | |
|---|---|---|---|
| JP | 1-128525 | A | 5/1989 |
| JP | H0922110 | A | 1/1997 |
| JP | 2008-112958 | A | 5/2008 |
| JP | 2010040990 | A * | 2/2010 |
| TW | 202031931 | A | 9/2020 |

OTHER PUBLICATIONS

Written Opinion (PCT/ISA/237) issued Oct. 26, 2021, by the Japanese Patent Office as the International Searching Authority for International Application No. PCT/JP2021/027703. (3 pages).

Office Action, issued on Dec. 2, 2024, issued for the corresponding Taiwanese patent application No. 110128653, 7 pages, with English translation.

Japanese Patent Office, Notice of Reasons for Refusal drafted on Jan. 24, 2024, which was issued for related Japanese Patent Application No. 2020-154036, with full English translation, 8 pages.

Office Action, issued on Aug. 13, 2025, which was issued for the corresponding Korean patent application No. 10-2023-7009889, 13 pages, with English translation.

Office Action issued Jul. 19, 2025 for the corresponding Chinese patent application No. 202180054193.7, with English machine translation, 13 pages.

* cited by examiner

FOCUSED CHARGED PARTICLE BEAM APPARATUS

CROSS-REFERENCE TO RELATED APPLICATION

This application is a 35 U.S.C. 371 National Phase Entry Application of International Patent Application PCT/JP2021/027703 filed Jul. 27, 2021, which claims priority to Japanese Patent Application No. 2020-154036 filed Sep. 14, 2020, the disclosures of which are incorporated herein in their entirety by reference, and priority is claimed to each of the foregoing.

FIELD OF THE INVENTION

The present invention relates generally to a focused charged particle beam apparatus equipped with a differential pumping device.

BACKGROUND

In recent years, a processing apparatus has been proposed which uses focused ion beams in a processing operation for repairing a pattern on a photomask employed in producing a flat panel display (FPD), such as a liquid crystal display (LCD) or an organic electroluminescent display, or repairing conductors arranged on a circuit substrate of a semiconductor device or a FPD (see Patent Literature 1). The processing apparatus includes a mount base in the shape of a table on which a photomask or a circuit substrate to be processed is mounted and a focused ion beam device equipped with a local exhaust ventilation system. The processing apparatus works to locally create a vacuum space using the local exhaust ventilation system and repair the pattern or the conductors within the vacuum space using focused ion beams. Use of such a type of processing apparatus eliminates the need for a large-sized vacuum chamber in which a photomask, a circuit substrate, and a focused ion beam device are disposed.

PRIOR ART DOCUMENT

Patent Literature

Patent Literature 1

Japanese Patent First Publication No. 2008-112958

SUMMARY OF THE INVENTION

Problem to be Solved by the Invention

The above type of processing apparatus is, however, designed to have a process-required substrate, such as a photomask or a circuit substrate, placed directly on the mount base and, thus, encounters a risk that foreign objects may be adhered to a lower surface of the process-required substrate or the mount base may cause physical damage to the lower surface of the process-required substrate. Particularly, the photomask is usually used as a master plate in transferring a circuit pattern on a target object. The adhesion of foreign objects or the damage to the lower surface of the photomask will, therefore, result in a failure in production of flat panel displays (FPDs), e.g., a photolithography operation.

The present invention was made in view of the above problems. It is an object of the invention to provide a focused charged particle beam apparatus which is free from the risk that foreign objects may be attached to a lower surface of a process-required substrate or the lower surface of the process-required substrate may be damaged.

Means for Solving the Problem

In order to eliminate the above problem, one mode of the invention provides a focused charged particle beam apparatus which comprises: (a) a support which supports a substrate to be processed; and (b) a focused charged particle beam column which is equipped with a differential pumping device which is configured to be movable to a location facing a given area of a process target surface of the substrate. The support bears only a periphery of the substrate while keeping the substrate horizontal. A positive pressure chamber is disposed below the substrate borne by the support. The positive pressure chamber works to exert a positive pressure on a whole of the process target area of the substrate to cancel deflection of the substrate arising from its own weight. A local depressurizing mechanism is arranged in the positive pressure chamber and placed out of contact with the substrate. The local depressurizing mechanism works to exert a negative pressure on a lower surface of the substrate to cancel a suction force created by the differential pumping device. The local depressurizing mechanism is movable relative to the substrate following movement of the differential pumping device while facing the differential pumping device through the substrate.

In the first preferred mode, a first floating pad may be arranged to surround an outer periphery of the differential pumping device and works to eject gas to the process target surface. Additionally, a second float pad may also be disposed to surround an outer periphery of the local depressurizing mechanism and works to eject gas to the lower surface of the substrate.

In the second preferred mode, the differential pumping device may be designed to have a head facing the process target surface of the substrate. The head has a substrate-facing surface which is opposed to the process target surface and also to have an inlet which is formed in the substrate-facing surface and extends around a central portion of the substrate-facing surface. The head has formed in the central portion an orifice defining a processing space in which the process target surface is to be processed. A vacuum pump may be connected to the inlet to create a high-level vacuum in the processing space by means of suction from the inlet with the substrate-facing surface facing the process target surface.

In the third preferred mode, the focused charged particle beam column may be disposed on an opposite side of the head to the substrate-facing surface. The focused charged particle beam column may include a chamber which connects with the orifice to establish communication with the processing space. The chamber has disposed therein a focused charged particle beam system which emits a focused charged particle beam through the orifice.

In the third preferred mode, the focused energy beam system may be implemented by a focused ion beam system which emits a focused ion beam.

In the fourth preferred mode, the substrate-facing surface may be designed to have a film-forming gas supply arranged closer to the central portion than the inlet is and serves to supply a film-forming gas.

Beneficial Advantages Offered by the Invention

The present invention realizes a focused charged particle beam apparatus which is designed to be free from adhesion of foreign objects to a lower surface of a substrate to be processed or damage to the low surface of the substrate.

MODE FOR CARRYING OUT THE INVENTION

A focused charged particle beam apparatus according to the present invention may be used for focused ion beam devices serving as repair devices, electron beam lithography systems functioning to transfer a geometric design directly to a process-required substrate, or electron scanning microscopes working to provide observation of the condition of a surface of a process-required substrate depending upon the type of energy beams to be emitted or the kind of an intended processing on the process-required substrate.

The focused charged particle beam apparatus according to the invention will be described below in detail with reference to the drawings. The first embodiment is an embodiment in which the focused charged particle beam apparatus is designed to use charged particle beams in the form of focused ion beams. It should be noted that the drawings are schematic, so that the dimension, ratio, number, and shape of each element differ from those of the real element. In addition, there are parts or portions in which the dimensional relationship, ratio, and shape are different among the drawings.

First Embodiment (Structure of Focused Ion Beam Device)

Figure 1:
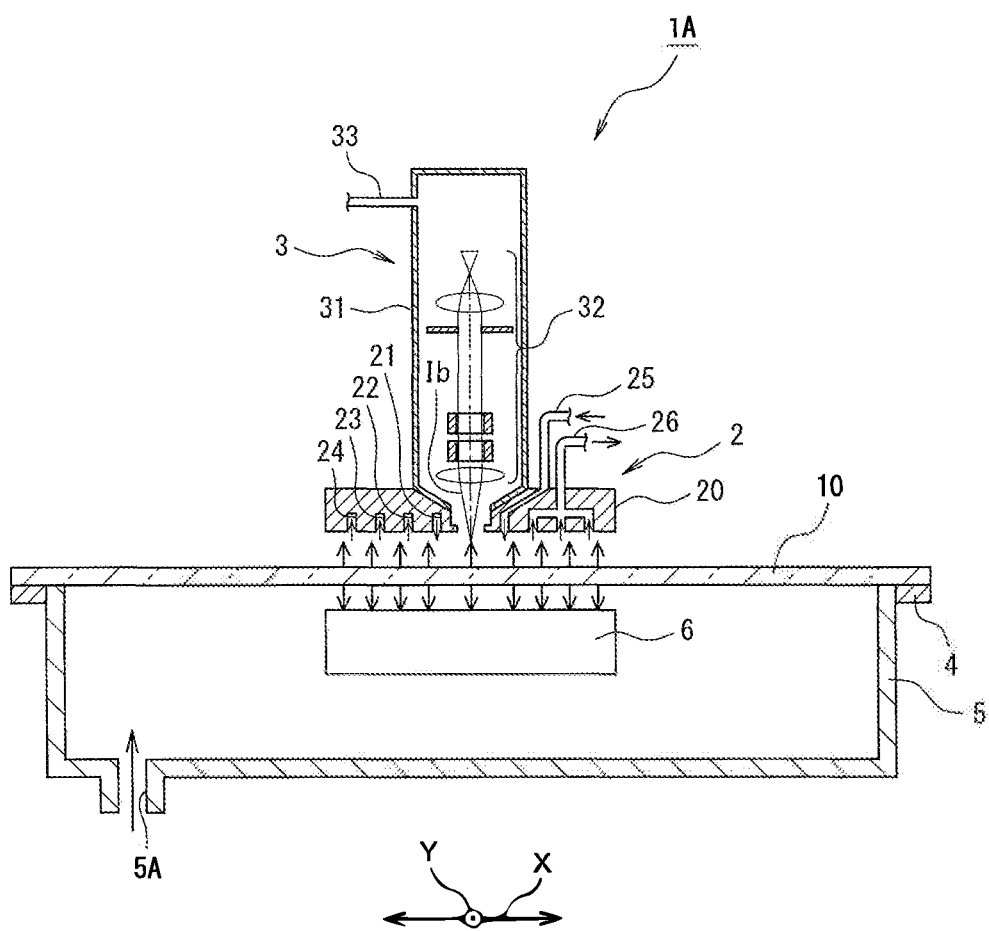
FIG. 1 is an explanatory sectional view of a focused ion beam apparatus according to the first embodiment of the invention.

FIG. 1 schematically illustrates the structure of the focused ion beam device 1A according to the first embodiment. The focused ion beam device 1A includes the differential pumping device 2, the focused ion beam column (will also be referred to below as FIB column) 3 serving as a focused charged particle beam column, the support 4, the positive pressure chamber 5, and the local depressurizing mechanism 6.

Support

Figure 2:
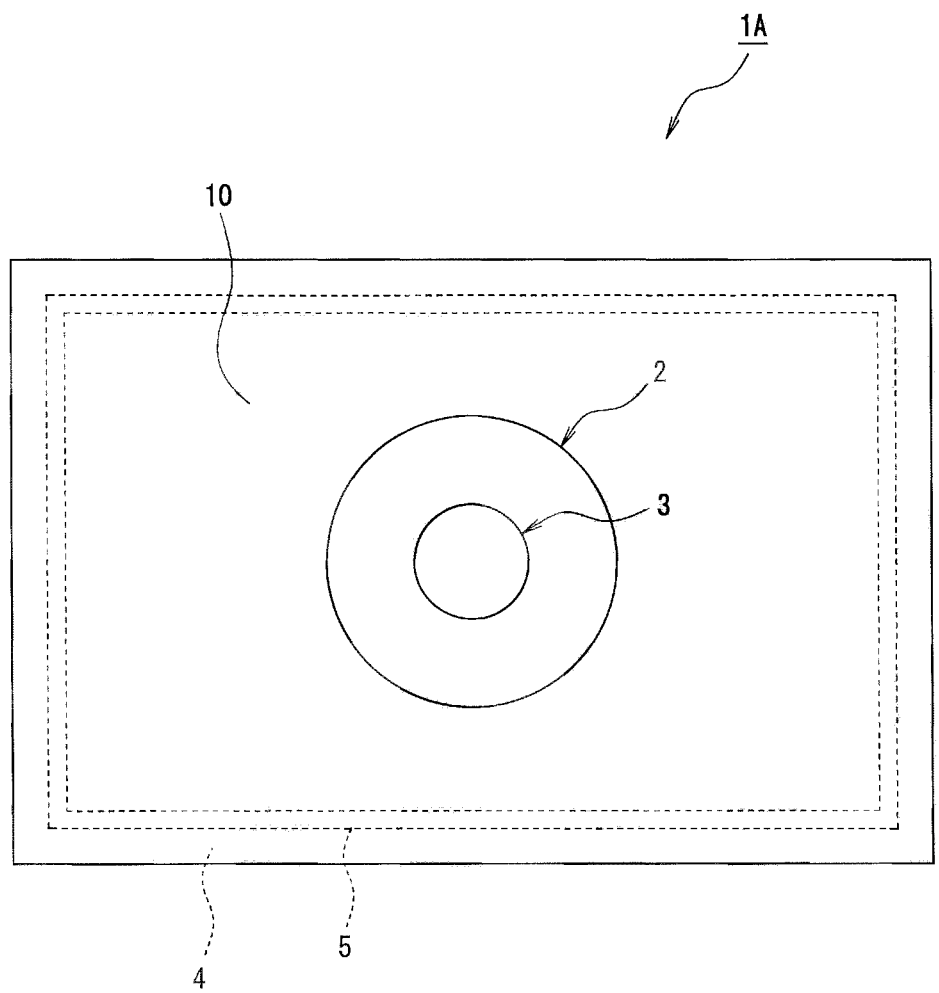
FIG. 2 is an explanatory plan view of a focused ion beam apparatus according to the first embodiment of the invention.

The support 4, as illustrated in FIG. 1, serves to mechanically support the substrate 10 to be processed (which will also be referred to as a process substrate). Specifically, the support 4 bears a peripheral edge of the process substrate 10. The support 4 is, as can be seen in FIG. 2, formed in the shape of a frame. The support 4 is equipped with a chuck, not shown, which clamps the peripheral edge of the process substrate 10. In this embodiment, the process substrate 10 is implemented by a large-sized photomask. The support 4 is fixed in location.

Differential Pumping Device

Figure 3:
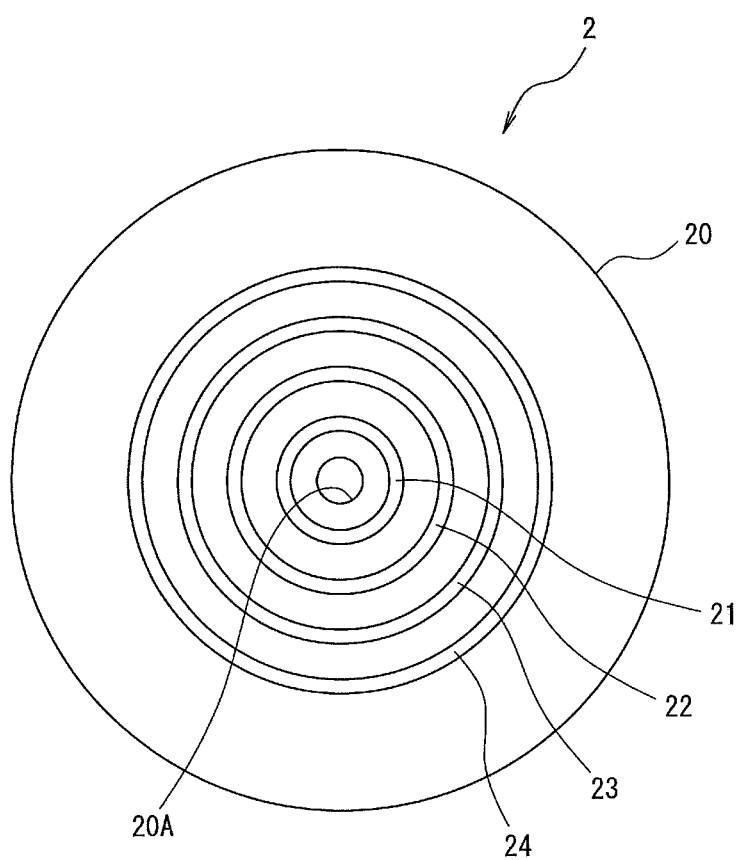
FIG. 3 is a bottom view a differential pumping device installed in a focused ion beam apparatus according to the first embodiment of the invention.

The structure of the differential pumping device 2 will be described with reference to FIGS. 1 and 3. FIG. 3 is a bottom view of the differential pumping device 2. The differential pumping device 2 is equipped with the head 20.

The head 20 is made of a disc-shaped metallic plate which is much smaller in area than the process substrate 10. The head 20 is moved in X- and Y-directions so that it faces a selected area of the process substrate 10.

The head 20, as clearly illustrated in FIG. 3, has four annular grooves 21, 22, 23, and 24 formed concentrically in a substrate-facing surface (i.e., a lower surface) of the head 30. The head 20 has formed therein the orifice 20A which defines a processing space inside the annular groove 21 that is an innermost one of the annular grooves 21, 22, 23, and 24. The processing space is a space which achieves processing of (i.e., emission of a focused ion beam to) an upper surface (i.e., a process target surface) of the process substrate 10. The FIB column 3, which will be described later, is joined to the orifice 20A in communication therewith. In this disclosure, a groove(s) shaped to surround the center of the head 20 is referred to as an annular groove, but however, it includes a circular looped groove, a rectangular looped groove, a C-shaped groove having an emitted portion, or a groove defined by a plurality of discrete segments arranged away from each other substantially in the form of a loop.

The innermost annular groove 21, as shown in FIG. 1, serves as a film-forming gas supply connected through the connecting pipe 25 to a deposition gas source, not shown, which supplies a deposition gas (i.e., CVD gas). The annular grooves 22, 23, and 24 function as inlets connected to a vacuum pump, not shown, through the connecting pipe 26. The head 20 is oriented to have the lower surface facing the upper surface (i.e., process target surface) of the process substrate 10 and functions to create a high-level vacuum beneath the orifice 20A with the aid of air suction from the annular grooves 22, 23, and 24. The annular grooves 22, 23, and 24 may alternatively be connected to discrete vacuum pumps without use of the connecting pipe 26.

The head 20 works to deliver the deposition gas from the innermost annular groove 21 to the high-level vacuum created below the orifice 20A for forming a film using the CVD techniques on an area of the process substrate which faces the orifice 20A.

Focused Ion Beam Column: Fib Column

The FIB column 3 is disposed on a surface (i.e., an upper surface) of the head 20 which is opposed to the surface of the head 20 which faces the process substrate 10. The FIB column 3 is joined to the head 20 with a top end thereof embedded in the orifice 20A of the head 20.

The FIB column 3 includes the cylindrical chamber 31 leading to the orifice 20A of the head 20 and the focused ion beam optical system 32 installed inside the cylindrical chamber 31. The cylindrical chamber 31 has an upper portion connected to a vacuum pump, not shown, through the connecting pipe 33. The FIB column 3 is configured to emit the ion beam Ib from the head thereof. The ion beam Ib passes through the orifice 20A toward the process substrate 10.

The focused ion beam optical system 32 includes an ion source which generates the ion beam Ib, a condenser lens which converges the ion beam Ib, a deflector which steers the ion beam Ib, and an objective electrostatic lens which focuses the ion beam Ib.

Tungsten hexacarbonyl ($W(CO)_6$) may be used as a deposition gas for CVD. When the focused ion beam Ib is emitted to the tungsten hexacarbonyl $W(CO)_6$ near the substrate 10, it will cause the tungsten hexacarbonyl $W(CO)_6$ to be decomposed into W and CO, leading to deposition of W on the substrate 10.

The FIB column 3 has an elevating mechanism, not shown, disposed on the upper end thereof. The elevating mechanism is connected to an XY gantry stage, not shown. The FIB column 3 and the differential pumping device 2 are, therefore, liftable upward or downward and movable in the X- and Y-directions. Specifically, in this embodiment, the differential pumping device 2 and the FIB column 3 are moved to the process substrate 10 retained by the support 4. The differential pumping device 2 and the FIB column 3 are configured to be movable in this embodiment, but however, may alternatively be fixed in location while the process substrate 10 may be designed to be movable.

Positive Pressure Chamber

The positive pressure chamber 5 is, as clearly illustrated in FIGS. 1 and 2, in the shape of a rectangular container with an opened upper end. The positive pressure chamber 5 has the air inlet 5A in the bottom thereof. The positive pressure chamber 5 is supplied with air from a delivery pump, not shown, through the air inlet 5A to keep the inside of the positive pressure chamber 5 at a positive pressure. The positive pressure chamber 5 is arranged to have an upper edge extending along an inner periphery of the support 4. The opened upper end of the positive pressure chamber 5, therefore, exerts a positive pressure entirely on an area of the lower surface of the process substrate 10 other than the peripheral edge thereof. The positive pressure chamber 5 is designed to exert the inner pressure on the process substrate 10 to cancel deflection of the process substrate 10 arising from its own weight, so that the process substrate 10 is kept flat.

Local Depressurizing Mechanism

The positive pressure chamber 5, as clearly illustrated in FIG. 1, has disposed therein the local depressurizing mechanism 6 movable in the X- and Y-directions. The local depressurizing mechanism 6 is in a disc shape which is identical in diameter with the head 20 of the differential pumping device 2. The local depressurizing mechanism 6 has formed in an upper surface thereof a plurality of air inlets arranged uniformly (see the gas inlets 6A of the local depressurizing mechanism 6 in the second embodiment shown in FIG. 6). The local depressurizing mechanism 6 has a flexible pipe, not shown, joined thereto, so that it is vacuumed through the flexible pipe. The suction power exerted by the upper surface of the local depressurizing mechanism 6 on the process substrate 10 is selected to be identical with that exerted from the differential pumping device 2 and the FIB column 3 on the process substrate 10. In other words, the suction power which is generated by the local depressurizing mechanism 6 and acts on the process substrate 10 is set to cancel that exerted by the differential pumping device 2 on the process substrate 10.

The positive pressure chamber 5 has disposed therein a transferring mechanism, not shown, which works to move the local depressurizing mechanism 6 in the X- and Y-directions. The local depressurizing mechanism 6 is configured to be moved following movement of the differential pumping device 2 and the FIB column 3 so that it is kept facing the differential pumping device 2 through the process substrate 10. In this embodiment, an elevating mechanism, not shown, is arranged to move and position the local depressurizing mechanism 6 in a vertical direction.

Operation of and Beneficial Advantage Offered by Focused Ion Beam Device in First Embodiment The operation of and beneficial advantages provided by the focused ion beam device 1A in this embodiment will be described below. First, the process substrate 10 is conveyed and positioned to the peripheral edge of the positive pressure chamber 5. Subsequently, air is delivered into the positive pressure chamber 5 through the air inlet 5A to regulate the pressure in the positive pressure chamber 5 to keep the process substrate 10 horizontally without being deformed or deflected when the process substrate 10 is placed on the upper edge of the positive pressure chamber 5. The process substrate 10 is disposed on the support 4 with the periphery thereof borne by the support 4.

The differential pumping device 2 and the FIB column 3 are moved to a location facing a process-required area of the process substrate 10. Specifically, the local depressurizing mechanism 6 is transported by the transferring mechanism, not shown, so that an upper surface of the local depressurizing mechanism 6 faces the differential pumping device 2 and the FIB column 3 through the process substrate 10.

Afterwards, the differential pumping device 2 and the FIB column 3 are moved until a distance between each of the differential pumping device 2 and the FIB column 3 and the process substrate 10 reaches a required value. Simultaneously, the local depressurizing mechanism 6 is lifted upward by the elevating mechanism, not shown, until a distance between the local depressurizing mechanism 6 and the process substrate 10 reaches a required value. The differential pumping device 2, the FIB column 3, and the local depressurizing mechanism 6 are placed physically out of contact with the process substrate 10.

Subsequently, the differential pumping device 2 and the FIB column 3 are operated to generate the same degree of suction power as that produced by the local depressurizing mechanism 6, or alternatively the degrees of suction power of the differential pumping device 2 and the local depressurizing mechanism 6 which are high enough to hold the process substrate 10 from being deflected upward or downward are produced for avoiding the upward or downward deflection of the process substrate 10.

The FIB column 3 emits the ion beam Ib in order to observe of the surface of an area of the process substrate 10 which faces the FIB column 3 or to repair the pattern on the area of the process substrate 10.

After completion of the above processing, the differential pumping device 2 and the FIB column 3 are moved upward by the elevating mechanism, not shown, and placed at a given distance away from the process substrate 10. Simultaneously, the local depressurizing mechanism 6 is moved downward by the elevating mechanism, not shown, and placed at a given distance away from the process substrate 10.

Subsequently, the differential pumping device 2 and the FIB column 3 are moved by the XY gantry state, not shown, to an area of the process substrate to be processed next. The local depressurizing mechanism 6 is also moved to a location facing the differential pumping device 2 and the FIB column 3 following the movement of the differential pumping device 2 and the FIB column 3. Afterwards, the same processing operation as that described above is performed repeatedly until the processing is completed on the entire area of the process substrate 10 other than the peripheral edge thereof.

The process substrate 10 after having undergone the above repairing is removed by the transferring mechanism, not shown, with the periphery thereof gripped.

First Comparative Example

Figure 7:
FIG. 7 is an explanatory sectional view which demonstrates a first comparative example in which a support retains only a peripheral edge of a substrate to be processed.

The first comparative example to the first embodiment will be described below with reference to FIG. 7. When the process substrate 10 is merely placed on the support 4, it will, as demonstrated in FIG. 7, cause the process substrate 10 to be greatly flexed under its own weight. It may be not necessary for semiconductor devices or FPDs with a small display surface to pay attention to the flexing thereof. However, in recent years, photomasks have been increased in size with an increase in size of the FPDs. Some photomasks have dimensions of several meters in width and height and thus need to deal with the flexing problem.

Second Comparative Example

Figure 8:
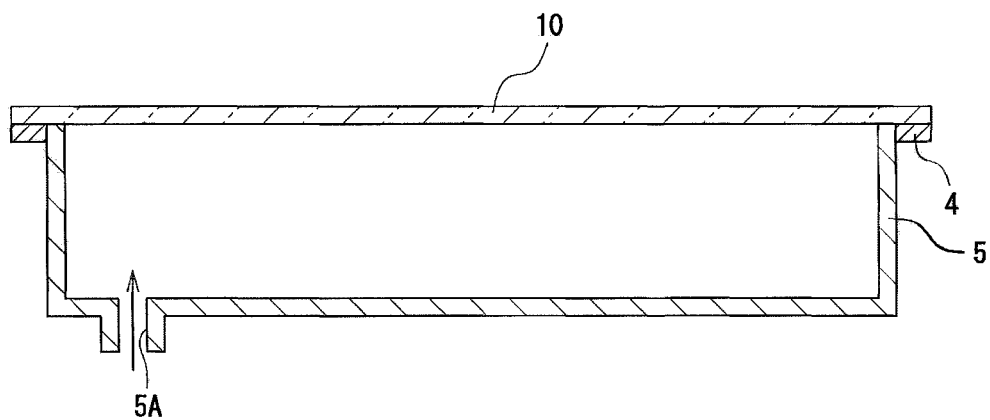
FIG. 8 is an explanatory sectional view which demonstrates a second comparative example in which a positive pressure chamber is arranged below a substrate to be processed.
Figure 9:
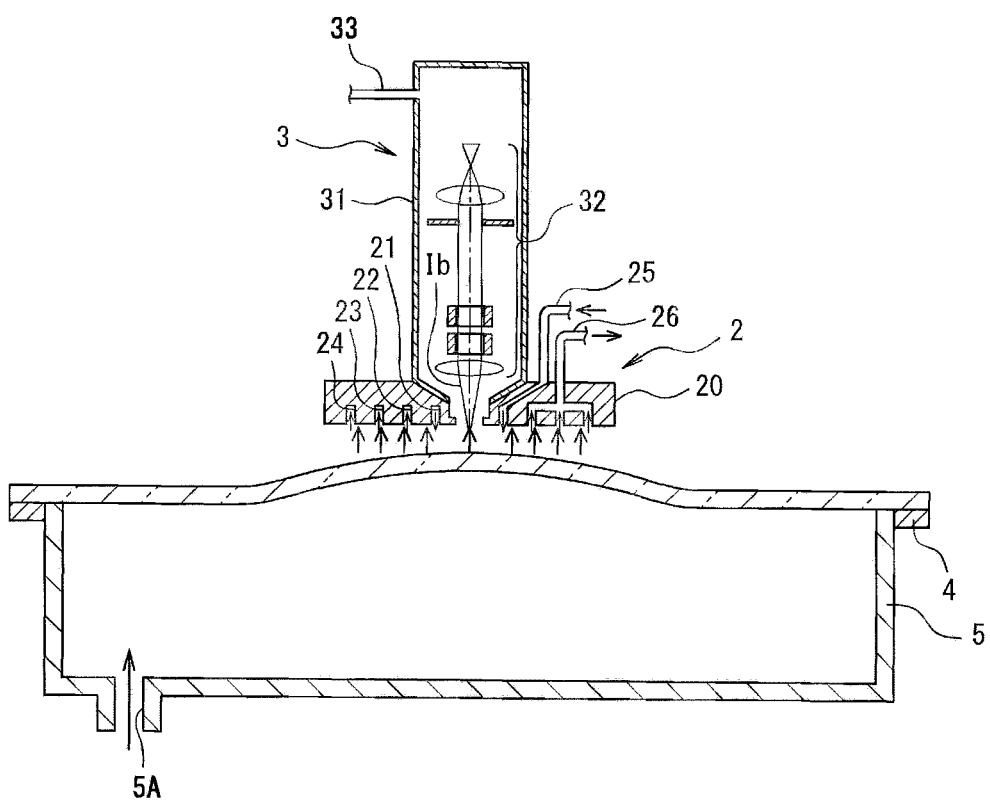
FIG. 9 is an explanatory sectional view which illustrates a second comparative example in which a positive pressure chamber is disposed below a substrate to be processed and which does not have a local depressurizing mechanism in the positive pressure chamber.

FIGS. 8 and 9 demonstrate the second comparative example. The second comparative example, like the first embodiment, includes the support 4 and the positive pressure chamber 5. FIG. 8 illustrates the process substrate kept horizontally flat with the aid of the pressure exerted by the positive pressure chamber 5. When the processing (e.g., the observation or repairing) is performed on the process substrate 10 kept flat by the differential pumping device 2 and the FIB column 3, it will, as illustrated in FIG. 9, cause the process substrate 10 to locally swollen by suction created by the differential pumping device 2 and the FIB column 3.

Beneficial Advantages Offered by the First Embodiment

The focused ion beam device 1A in this embodiment is, as apparent from the above discussion, capable of eliminating the need for mounting the process substrate 10 on a table-like stage, thereby minimizing a risk that foreign objects, such as particles, may be attached to an effective area of the lower surface of the process substrate 10 other than the periphery thereof or the lower surface of the process substrate 10 may be damaged by the stage.

Second Embodiment

The focused ion beam device 1B according to the second embodiment will be described below with reference to FIGS. 4 to 6. The focused ion beam device 1B is, as clearly illustrated in FIGS. 4 and 5, equipped with the first air float pad 7 which is integrally arranged outside the differential pumping device 2 and fully surrounds the periphery of the differential pumping device 2. The first air float pad 7 connects with a delivery pump through a connecting pipe, not shown. The delivery pump works to deliver nitrogen gas (N2) that is inert gas. The first air float pad 7 is in the shape of a flat annular pipe which has formed in a lower surface thereof a plurality of slit-shaped openings or a circular opening through which inert gas is discharged. The inert gas outputted from the first air float pad 7 urges or presses the upper surface of the process substrate 10.

Figure 4:
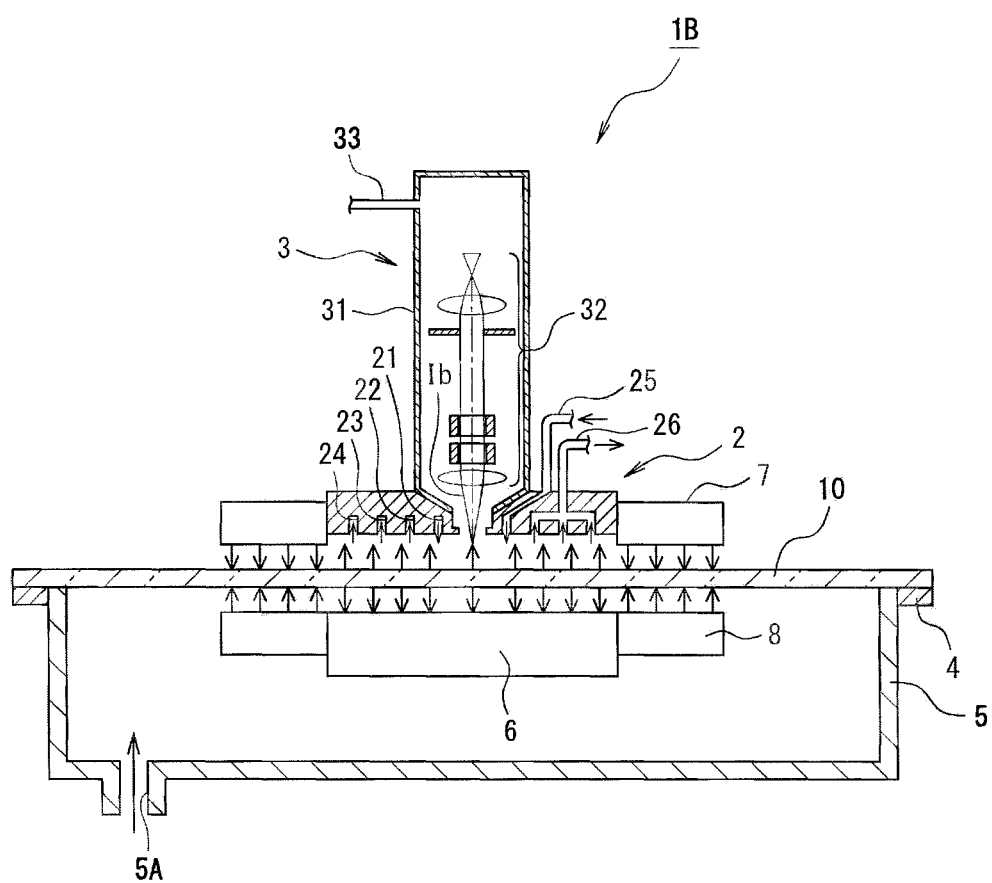
FIG. 4 is an explanatory sectional view of a focused ion beam apparatus according to the second embodiment of the invention.
Figure 5:
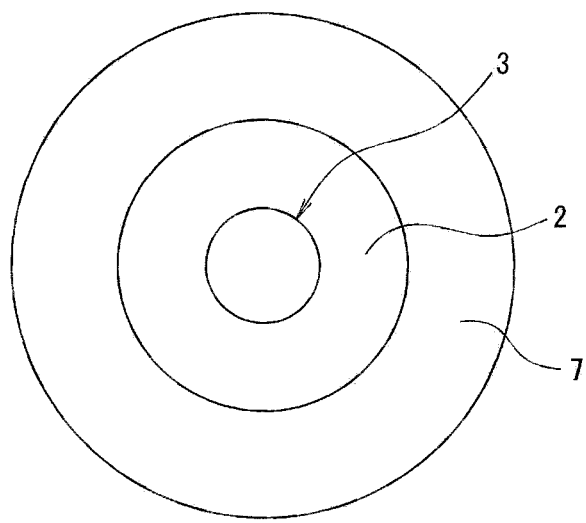
FIG. 5 is a plan view of a differential pumping device and a focused ion beam column equipped with a first float pad in a focused ion beam apparatus according to the second embodiment of the invention.
Figure 6:
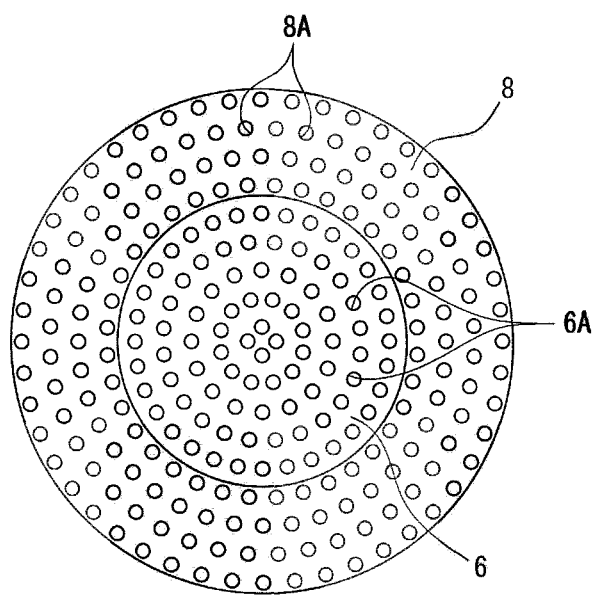
FIG. 6 is an explanatory sectional view of a local depressurizing mechanism equipped with a second float pad in a focused ion beam apparatus according to the second embodiment of the invention.

The focused ion beam device 1B in this embodiment is, as illustrated in FIGS. 4 and 6, also equipped with the second air float pad 8 which is integrally arranged outside the local depressurizing mechanism 6 and fully surrounds the periphery of the local depressurizing mechanism 6. The second air float pad 8 connects with a delivery pump through a connecting pipe, not shown. The delivery pump works to deliver air. The second air float pad 8 is, like the first air float pad 8, in the shape of a flat annular pipe identical in size with the first air float pad 7. The second air float pad 8, as illustrated in FIG. 6, has the gas outlets 8A formed in an upper surface thereof, like the gas inlets 6A in the upper surface of the local depressurizing mechanism 6. Air outputted from the gas outlets 8A presses the lower surface of the process substrate 10. Other arrangements of the focused ion beam device 1B are identical with those of the focused ion beam device 1A in the first embodiment.

The first air float pad 7 ejects inert gas toward the upper surface of the process substrate 10 to create a gas curtain. In other words, the first air float pad 7 works to urge the differential pumping device 2 and the FIB column 3 away from the process substrate 10. Use of the inert gas enables the inside of the cylindrical chamber 31 to be purged with the inert gas, thereby resulting in removal of contaminants from the cylindrical chamber 31. The first air float pad 7 functions to eject inert gas to lift the differential pumping device 2 and the FIB column 3 away from the process substrate 10, thereby canceling a vacuum pressure created by the differential pumping.

Particularly, the first air float pad 7 functions to avoid contact of the differential pumping device 2 and the FIB column 3 with the process substrate 10. Similarly, the second air float pad 8 works to eject air to avoid contact of the local depressurizing mechanism 6 and the second air float pad 8 with the process substrate 10. Since each of the first air float pad 7 and the second air float pad 8 ejects air to the process substrate 10, if placed to block the ejection of air, the process substrate 10 will undergo a high degree of repelling force from the air. The use of the first air float pad 7 and the second air float pad 8, therefore, enhances the ability to hold the differential pumping device 2, the FIB column 3, and the local depressurizing mechanism 6 from contacting the process substrate 10.

Other Embodiments

Although the embodiments of the present invention have been described, the description and drawings, which is a part of the disclosure of these embodiments, should not be understood to limit the present invention. From this disclosure, alternative embodiments, examples, and operational technology should be clear to a person skilled in the art.

For instance, the focused ion beam devices 1A and 1B in the above embodiments use focused ion beams as energy beams, but however, the present invention may alternatively be applied to CVDs using laser beams as energy beams or repair devices used for laser etching.

The focused ion beam devices 1A and 1B in the above embodiments have been described as being designed as repair devices, but however, may also be used with electron-beam lithography systems functioning to directly draw patterns on a substrate or electron scanning microscopes capable of observing the condition of the surface of a substrate.

Each of the focused ion beam devices 1A and 1B in the above embodiments has the head 20 made of a circular metallic plate, but the head may alternatively be designed to have another structure as long as it is capable of performing a differential pumping function.

Each of the focused ion beam devices 1A and 1B in the above embodiments has the support 4 and the positive pressure chamber 5 fixed in location, but the support 4 and the positive pressure chamber 5 may alternatively be designed to move toward the process substrate 10.

In each of the focused ion beam devices 1A and 1B in the above embodiments, the number of the annular grooves formed in the differential pumping device 2 is not limited to four, but may be two or more as long as they are at least capable of delivering or sucking gas. The differential pumping device 2 may alternatively be designed to have a plurality of openings arranged uniformly instead of the annular grooves.

EXPLANATION OF REFENCE SYMBOLS 1A, 1B focused ion beam device
2 differential pumping device
3 focused ion beam column (FIB)
4 support
5 positive pressure chamber
5A air inlet
6 local depressurizing mechanism
6A gas inlet
7 first air float pad
2 second air float pad
8A gas outlet
10 substrate to be processed
20 head
20A orifice
21, 22, 23, 24 annular grooves (inlets)
25, 26 connecting pipe
31 cylindrical chamber
32 focused ion beam optical system
33 connecting pipe

What is claimed is:

1. A focused charged particle beam apparatus comprising:
a support which supports a substrate to be processed; and
a focused charged particle beam column which is equipped with a differential pumping device which is configured to be movable to a location facing a given area of a process target surface of the substrate, wherein the support bears only a Periphery of the substrate while keeping the substrate horizontal,
a positive pressure chamber is disposed below the substrate borne by the support, the positive pressure chamber working to exert a positive pressure on a whole of the process target area of the substrate to cancel deflection of the substrate arising from its own weight, and
a local depressurizing mechanism is arranged in the positive pressure chamber and placed out of contact with the substrate, the local depressurizing mechanism working to exert a negative pressure on a lower surface of the substrate to cancel a suction force created by the differential pumping device, the local depressurizing mechanism being movable relative to the substrate following movement of the differential pumping device while facing the differential pumping device through the substrate,
wherein a first floating pad is arranged so as to surround an outer periphery of the differential pumping device and works to eject gas to the process target surface, and a second float pad is disposed so as to surround an outer periphery of the local depressurizing mechanism and works to eject gas to the lower surface of the substrate.

2. The focused charged particle beam apparatus as set forth in claim 1, wherein the differential pumping device has a head facing the process target surface of the substrate, the head having a substrate-facing surface which is opposed to the process target surface and also having an inlet which is formed in the substrate facing surface and extends around a central portion of the substrate-facing surface,
the head has formed in the central portion an orifice defining a processing space in which the process target surface is to be processed, and
a vacuum pump is connected to the inlet to create a high-level vacuum in the processing space by means of suction from the inlet with the substrate facing surface facing the process target surface.

3. The focused charged particle beam apparatus as set forth in claim 2, wherein the focused charged particle beam column is disposed on an opposite side of the head to the substrate-facing surface,
the focused charged particle beam column includes a chamber which connects with the orifice to establish communication with the processing space, and
the chamber has disposed therein a focused charged particle beam system which emits a focused charged particle beam through the orifice.

4. The focused charged particle beam apparatus as set forth in claim 3, wherein the focused charged particle beam system is implemented by a focused ion beam system which emits a focused ion beam.

5. The focused charged particle beam apparatus as set forth in claim 2, wherein the substrate-facing surface has a film-forming gas supply arranged closer to the central portion than the inlet and serves to supply a film-forming gas.

6. The focused charged particle beam apparatus as set forth in claim 3, wherein the substrate-facing surface has a film-forming gas supply arranged closer to the central portion than the inlet is and serves to supply a film-forming gas.

7. The focused charged particle beam apparatus as set forth in claim 4, wherein the substrate-facing surface has a film-forming gas supply arranged closer to the central portion than the inlet is and serves to supply a film-forming gas.

* * * * *